US009838025B1

(12) United States Patent
Deng et al.

(10) Patent No.: US 9,838,025 B1
(45) Date of Patent: Dec. 5, 2017

(54) METHOD FOR REDUCING LOCK TIME IN A CLOSED LOOP CLOCK SIGNAL GENERATOR

(71) Applicant: Apple Inc., Cupertino, CA (US)

(72) Inventors: Wei Deng, San Jose, CA (US); Dennis Fischette, Jr., Mountain View, CA (US); Gin Yee, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/233,124

(22) Filed: Aug. 10, 2016

(51) Int. Cl.
*H03L 7/085* (2006.01)
*H03L 7/089* (2006.01)

(52) U.S. Cl.
CPC .................................. *H03L 7/0891* (2013.01)

(58) Field of Classification Search
None
See application file for complete search history.

(56) References Cited

U.S. PATENT DOCUMENTS

| 6,466,058 | B1 | 10/2002 | Goldman | |
|---|---|---|---|---|
| 6,621,354 | B1 * | 9/2003 | Kornblum | H03L 7/107 327/156 |
| 6,624,705 | B1 | 9/2003 | Huard | |
| 7,095,287 | B2 * | 8/2006 | Maxim | H03L 7/0893 331/11 |
| 7,265,635 | B2 | 9/2007 | Meltzer | |
| 7,859,313 | B2 | 12/2010 | Chien | |
| 8,487,707 | B2 * | 7/2013 | Wang | H03L 7/087 327/150 |
| 8,552,773 | B2 | 10/2013 | Thomas | |
| 8,884,671 | B2 * | 11/2014 | Grabinski | H03L 7/087 327/147 |

* cited by examiner

*Primary Examiner* — Jeffrey Zweizig
(74) *Attorney, Agent, or Firm* — Meyertons, Hood, Kivlin, Kowert & Goetzel, P.C.

(57) ABSTRACT

An apparatus includes circuitry and an oscillator circuit that may be configured to generate a clock signal dependent upon a control signal. The circuitry may be configured to perform a frequency measurement of the clock signal. In response to a determination that the frequency of the clock signal is greater than a first threshold, the circuitry may also be configured to perform a phase comparison between a divided clock signal and a reference clock signal, and to adjust a value of the control signal such that the adjusted value depends upon a result of the comparison. In response to a determination that the frequency of the clock signal is less than the first threshold, the circuitry may be configured to adjust the value of the control signal such that the adjusted value depends upon a result of the measurement.

20 Claims, 12 Drawing Sheets

METHOD FOR REDUCING LOCK TIME IN A CLOSED LOOP CLOCK SIGNAL GENERATOR

BACKGROUND

Technical Field

Embodiments described herein are related to the field of integrated circuit implementation, and more particularly to the implementation of clock signal generators.

Description of the Related Art

Systems-on-a-chip (SoCs) designs may include one or more closed-loop clock signal generators, configured to output a clock signal at a target frequency. Closed-loop clock signal generators may utilize a reference clock to generate output clock signals of a different frequency than the reference clock. In some embodiments, the target frequency may be programmable, allowing a processor in the SoC to adjust the clock frequency to a suitable value for current operating conditions, e.g., set a low frequency value to conserve power when fewer tasks are active, or vice versa. Some examples of such closed-loop clock generators include phase-locked loops (PLLs), delay-locked loops (DLLs), and frequency-locked loops (FLLs).

Some closed-loop clock generators, such as, for example, PLLs, may experience cycle-slip when adjusting from an initial frequency to the target frequency. "Cycle-slip" may occur when a phase difference between an edge of the output clock signal and an edge of a reference clock is greater than $2\pi$ radians. Cycle-slip may cause delays for the PLL to acquire lock, i.e., generate an output clock signal at or near the target frequency.

SUMMARY OF THE EMBODIMENTS

Various embodiments of a clock generation unit are disclosed. Broadly speaking, a system, an apparatus, and a method are contemplated in which the apparatus includes circuitry and an oscillator circuit that may be configured to generate a clock signal dependent upon a control signal. The circuitry may be configured to perform a measurement of a frequency of the clock signal. The circuitry may be further configured to perform a comparison of a phase of a divided clock signal to a phase of a reference clock signal in response to a determination that the frequency of the clock signal is greater than a first threshold frequency. The phase of the divided clock signal may be dependent upon a phase of the clock signal. In response to the determination that the frequency of the clock signal is greater than the first threshold frequency, the circuitry may be configured to adjust a value of the control signal such that the adjusted value depends upon a result of the comparison. In response to a determination that the frequency of the clock signal is less than the first threshold frequency, the circuitry may be configured to adjust the value of the control signal such that the adjusted value depends upon a result of the measurement.

In a further embodiment, the circuitry may include a phase detection circuit configured to co perform the comparison. The circuitry may be further configured to decouple the clock signal from an input node of the phase detection circuit in response to the determination that the frequency of the clock signal is less than the first threshold frequency.

In another embodiment, the circuitry may include a charge pump configured to generate an output current dependent upon a signal at an input node of the charge pump. The circuitry may be further configured to decouple an output of the phase detection circuit from the input node of the charge pump in response to the determination that the frequency of the clock signal is less than the first threshold frequency.

In one embodiment, the circuitry may include a charge pump configured to generate an output current dependent upon a current source. The circuitry may be further configured to enable the current source in response to the determination that the frequency of the clock signal is less than the first threshold frequency.

In a further embodiment, the circuitry may include a low pass filter circuit. The circuitry may be further configured to adjust a frequency response of the low pass filter circuit in response to the determination that the frequency of the clock signal is less than the first threshold frequency.

In one embodiment, the circuitry includes a phase detection circuit. The circuitry may be further configured to place the phase detection circuit into a reduced power mode in response to the determination that the frequency of the clock signal is less than the first threshold frequency.

In another embodiment, in response to a determination that the frequency of the clock signal is less than a second threshold frequency, the circuitry may be further configured to adjust the value of the control signal such that the adjusted value depends upon the result of the comparison. The second threshold frequency may be greater than the first threshold frequency. In response to a determination that the frequency of the clock signal is greater than the second threshold frequency, the circuitry may be configured to adjust the value of the control signal such that the adjusted value depends upon the result of the measurement.

BRIEF DESCRIPTION OF THE DRAWINGS

The following detailed description makes reference to the accompanying drawings, which are now briefly described.

Figure 1:
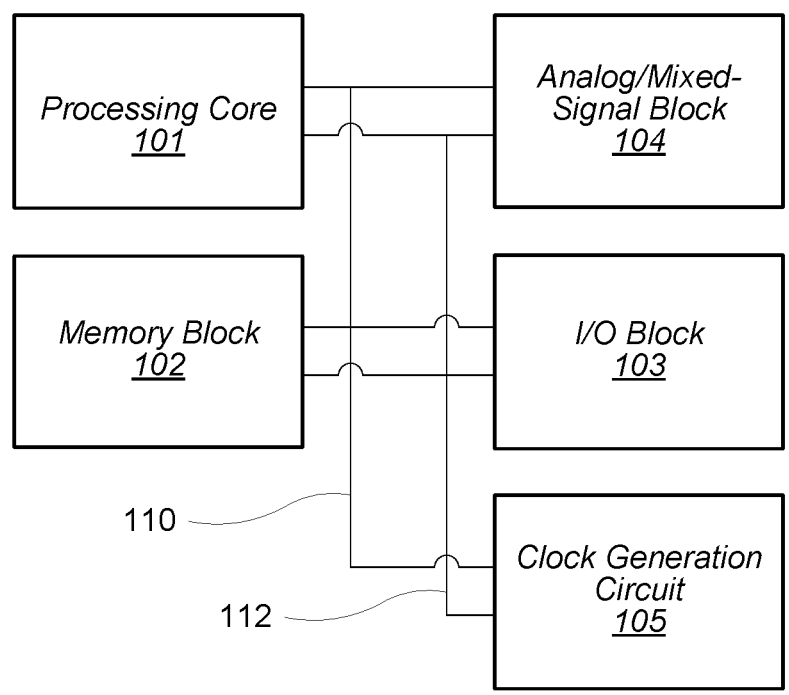
FIG. 1 illustrates an embodiment of a various circuit blocks coupled to a clock generation circuit.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

Integrated circuits (ICs), such as, e.g., a system-on-a-chip (SoC) may include multiple functional circuits utilizing one or more high frequency clock signals. In some cases, certain tasks may require the accuracy of such high frequency clock signals fall within predetermined ranges. Clock generation circuits, however, may be susceptible to changes in operating conditions, such as a voltage level of a power supply, or operating temperature, that reduce the accuracy of their generated clock signals. Additionally, in some embodiments, clock generation circuits are programmable, allowing the frequency of the generated clock signal to be adjusted during operation.

In some embodiments, a closed-loop clock generator may be used to generate high frequency clock signals that meet both accuracy and adjustability requirements of a given IC. A "closed-loop" clock generator, as used and described herein, refers to a clock generation circuit in which at least one parameter or condition of an output clock signal is fed back into the clock generation circuit and used to adjust the output clock signal to achieve and maintain target operating parameters of the clock signal, such as, for example, the frequency of the output clock signal. Generally speaking, a closed-loop clock generator in an IC may generate a clock signal and "lock" the clock signal at or near a target frequency. As used herein, to "lock" or "achieve lock" refers to a closed-loop clock generator generating a clock signal within a predetermined range of a target (i.e., desired or selected) frequency. In some embodiments, the target frequency may be changed during operation of the IC for any suitable reason. For example, the target frequency may be reduced to conserve power or may be increased to speed execution of a task. When a target frequency of a closed-loop clock generator is changed, the locked condition may be lost and the clock generator may operate in an unlocked state until the output frequency reaches a frequency close enough to the target frequency to satisfy the lock condition for the clock generator.

While a closed-loop clock generator is running in an unlocked state, a condition referred to as cycle slip may occur. Referring to a phase-locked loop (PLL) for example, the PLL compares rising or falling transitions of a reference clock signal to corresponding transitions of a feedback clock signal that is generated from an output clock signal. Depending if a feedback clock transition occurs ahead of or behind a corresponding transition of the reference clock signal, the PLL decreases or increases, respectively, the frequency of the output clock signal to bring transitions of the two clock signals closer together. When the reference clock signal and the feedback clock signal are running at different frequencies, the frequency difference accumulates as phase error. "Cycle-slip" occurs when the frequency difference persists for a sufficient time to cause the resulting phase error to be greater than the period of either clock. When cycle-slip occurs, two successive reference clock signal transitions may occur without a corresponding transition of the output clock signal.

The various embodiments illustrated in the drawings and described below may allow a clock signal generator to mitigate cycle slip and reduce an amount of time a closed-loop clock generator takes to achieve lock. These embodiments may employ techniques that also reduce power consumption while in the unlocked state.

A block diagram of an embodiment of an integrated circuit (IC) is illustrated in FIG. 1. In the illustrated embodiment, IC 100 includes Processing Core 101 coupled to Memory Block 102, I/O Block 103, Analog/Mixed-Signal Block 104, Clock Generation Circuit 105, all coupled through bus 110. Additionally, Clock Generation Circuit 105 provides a clock signal 112 to the circuit blocks in IC 100. In various embodiments, IC 100 may correspond to a system on a chip (SoC) for use in a mobile computing application such as, e.g., a tablet computer, smartphone or wearable device.

Processing Core 101 may, in various embodiments, be representative of a general-purpose processor that performs computational operations. For example, Processing Core 101 may be a central processing unit (CPU) such as a microprocessor, a microcontroller, an application-specific integrated circuit (ASIC), or a field-programmable gate array (FPGA). In some embodiments, Processing Core 101 may include multiple CPU cores and may include one or more register files and memories. In various embodiments, Processing Core 101 may implement any suitable instruction set architecture (ISA), such as, e.g., PowerPC™, or x86 ISAs, or combination thereof. Processing Core 101 may include one or more bus transceiver units that allow Processing Core 101 to communication to other functional circuits via bus 110, such as, Memory Block 102, for example.

Memory Block 102 may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as Memory Block 102 and other embodiments may include more than two memory blocks (not shown). In some embodiments, Memory Block 102 may be configured to store program instructions that may be executed by Processing Core 101. Memory Block 102 may be configured to store data to be processed, such as graphics data, for example. Memory Block 102, may, in some embodiments, include a memory controller for interfacing to memory external to IC 100, such as, for example, one or more DRAM chips.

I/O Block 103 is, in one embodiment, configured to coordinate data transfer between IC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. I/O Block 103 may include general-purpose input/output pins (I/O pins). In some embodiments, I/O Block 103 may be configured to implement a version of Universal Serial Bus (USB) protocol, IEEE 1394 (Firewire®) protocol, or an Ethernet (IEEE 802.3) networking standard.

In the illustrated embodiment, Analog/Mixed-Signal Block 104 includes one or more analog circuits. For example Analog/Mixed-Signal Block 104 may include a crystal oscillator, an internal oscillator, a phase-locked loop (PLL), delay-locked loop (DLL), or frequency-locked loop (FLL). One or more analog-to-digital converters (ADCs) or digital-to-analog converters (DACs) may also be included in analog/mixed signal block 104. In some embodiments, Analog/Mixed-Signal Block 104 may include radio frequency (RF) circuits that may be configured for operation with cellular telephone networks, or other suitable RF-based networks. Analog/Mixed-Signal Block 104 may include one or more voltage regulators to supply one or more voltages to various functional circuits and circuits within those blocks.

Clock Generation Circuit 105 may be configured to initialize and manage outputs of one or more clock sources. In various embodiments, the clock sources may be located in Analog/Mixed-Signal Block 104, in Clock Generation Circuit 105, in other blocks with IC 100, or come from external to IC 100, coupled through one or more I/O pins. In some embodiments, Clock Generation Circuit 105 may configure a selected clock source before it is distributed throughout IC 100. Clock Generation Circuit 105 may include one or more clock sources. In some embodiments, Clock Generation Circuit 105 may include one or more of PLLs, FLLs, DLLs, internal oscillators, oscillator circuits for external crystals, etc. One or more clock output signals 112 may provide clock signals to various circuits of IC 100.

It is noted that the IC illustrated in FIG. 1 is merely an example. In other embodiments, a different number of circuit blocks and different configurations of circuit blocks may be possible, and may depend upon a specific application for which the IC is intended.

Figure 2:
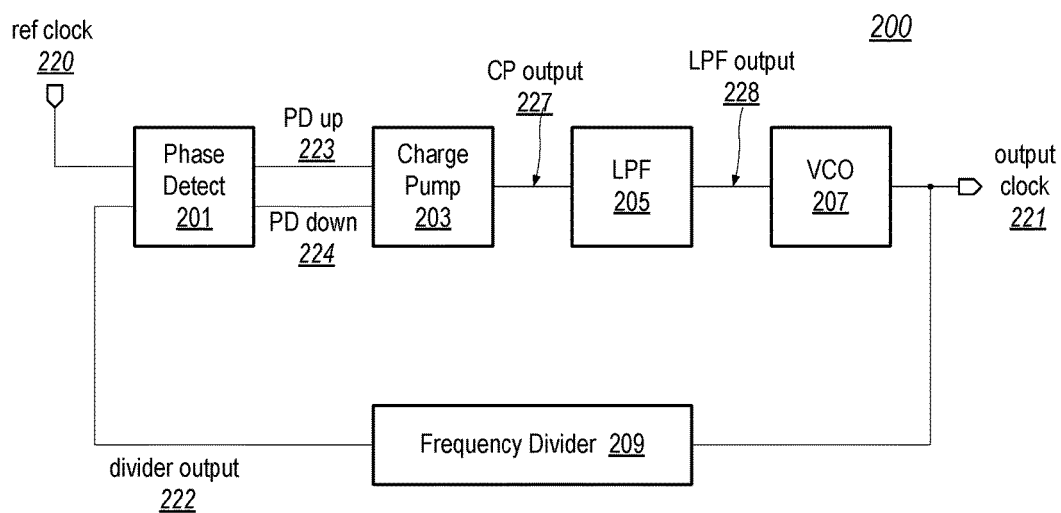
FIG. 2 illustrates a block diagram of a first embodiment of a clock generation circuit.

Turning to FIG. 2, a block diagram of a first embodiment of a clock generation circuit is illustrated. Clock generation circuit 200 may represent a component or sub-component within an integrated circuit, such as, IC 100, for example. In the illustrated embodiment, clock generation circuit 200 includes a PLL that may be included in Clock Generation Circuit 105 in FIG. 1. In other embodiments, clock generation circuit 200 may include any suitable closed-loop clock signal generator circuit. An output of clock generation circuit 200, i.e., output clock 221, may be used as a clock source to one or more functional circuits of IC 100, such as, for example, Processing Core 101. Clock generation circuit 200 includes Phase Detect 201 coupled to Charge Pump 203 via PD up signal 223 and PD down signal 224. Charge Pump 203 is coupled to low pass filter (LPF) 205, which is, in turn, coupled to voltage controlled oscillator (VCO) 207, which is then coupled to Frequency Divider 209. Phase Detect 201 receives reference clock (ref clock) 220 and the output signal of the frequency divider (divider output) 222 as inputs.

Clock generation circuit 200 generates output clock 221 dependent upon ref clock 220. In one embodiment, clock generation circuit 200 is programmed to generate output clock 221 at a target frequency greater than the frequency of ref clock 220. In other embodiments, clock generation circuit 200 may be programmed to generate output clock 221 at a target frequency greater than or less than the frequency of ref clock 220. Output clock 221 is generated by VCO 207. Frequency Divider 209 receives output clock 221 and generates divider output 222. Phase Detect 201 receives divider output 222 and ref clock 220. Ref clock 220 may be generated by any suitable clock source, such as, e.g., a crystal oscillator circuit, configured to generate ref clock 220 at a known constant frequency with a desired level of accuracy.

Phase Detect 201 compares the phase between ref clock 220 and divider output 222. In various embodiments, Phase Detect 201 may be referred to as a "phase detector" or "phase-frequency detector." In some embodiments, Phase Detect 201 may determine a timing difference between the a rising and/or falling edges of ref clock 220 and divider output 222 and, generate one or more output signals dependent upon the determined timing difference. In the illustrated embodiment, Phase Detect 201 generates two output signals. PD up signal 223 is asserted high when a rising transition (also referred to as a rising edge) occurs on ref clock 220 before a corresponding rising edge on divider output 222. A length of time that PD up signal 223 may remain asserted depends upon a time difference between the rising edge of ref clock 220 and the rising edge of divider output 222, i.e., the phase difference between ref clock 220 and divider output 222. If the rising edge of divider output 222 occurs after the rising edge of ref clock 220, then the frequency of output clock 221 may be lower than the target frequency and, therefore, need to be increased. PD down signal 224 is asserted high when the rising edge occurs on divider output 222 before the corresponding rising edge of ref clock 220. In this case, the frequency of output clock 221 may be higher than the target frequency and, accordingly, need to be decreased.

Charge Pump 203 receives the PD up signal 223 and PD down signal 224 from Phase Detect 201 and generates CP output signal 227 with a voltage level dependent upon the two outputs. When PD up signal 223 is asserted, then Charge Pump 203 sources current into CP output signal 227. Conversely, when PD down signal 224 is asserted, then Charge Pump 203 sinks current from CP output signal 227.

CP output signal 227 is received by LPF 205. LPF 205, in the illustrated embodiment, may include any suitable combination of circuit elements that allows signals with low frequencies to pass through to the output while attenuating signals with high frequencies. In various embodiments, LPF 205 may correspond to passive circuits including only capacitors and resistors, or correspond to active circuits that may include analog comparators or operational amplifiers (OpAmps) in addition to passive components. Example embodiments of low pass filters are presented later herein.

While the current of CP output signal 227 may change relatively quickly in response to changes in PD up signal 223 and PD down signal 224, a voltage level of the output of LPF 205, LPF output signal 228, changes more slowly in comparison. In response to changes in the current sourced into or sunk from CP output signal 227, capacitors in LPF 205 may charge or discharge respectively. In some embodiments, such as, e.g., when both PD up signal 223 and PD down signal 224 are de-asserted, a first capacitor in LPF 205 may discharge while a second capacitor receives the charge lost by the first capacitor, resulting in what is referred to herein as "charge redistribution."

Due to the slower response of LPF 205, for LPF output signal 228 to rise to a higher voltage level within a given time period, CP output signal 227 must remain at a higher voltage level for a majority of the given time period, and vice versa for the voltage level to fall to a lower voltage level. In other words, brief, high frequency pulses are filtered out of LPF output signal 228. Accordingly, if PD up signal 223 is asserted more often than PD down signal 224 (indicating that the frequency of output clock 221 is too low), CP output signal 227 may rise to a higher voltage level, thereby causing LPF output signal 228 to rise to a higher voltage level. On the other hand, if PD down signal 224 is asserted more frequently than PD up signal 223 (indicating the frequency of output clock 221 is too high), then CP output signal 227 may fall to a lower voltage level, resulting in LPF output signal 228 to fall to a lower voltage level.

LPF output signal 228 is sent to VCO 207. VCO 207 generates output clock 221 at a frequency that is dependent upon the voltage level of LPF output signal 228. In one embodiment, a higher voltage level received by VCO 207 corresponds to a higher frequency of output clock 221 and to the contrary for lower voltage level of LPF output signal 228. Output clock 221, in the illustrated embodiment, is received by Frequency Divider 209. Frequency Divider 209 generates a divided output clock signal, divider output 222. Divider output 522 is derived from output clock 221 and dependent upon settings for Frequency Divider 209. Settings for Frequency Divider 209 include a divisor value. In various embodiments, the divisor value may include select fractional values, integer values within a predetermined range, or a subset of integers, such as, for example, powers of two (1, 2, 4, 8 . . . ). Divider output 222 is generated with a frequency equal to the frequency of output clock 221 divided by the divisor value. Subsequently, when clock generation circuit 200 is locked and divider output 222 has a frequency equal to ref clock 220, the frequency of output clock 221 is equal to the frequency of ref clock 220 multiplied by the divisor value.

In the illustrated embodiment, clock generation circuit 200 is in a locked state once corresponding edges of ref clock 220 and divider output 222 occur within a predetermined amount of time of one another. Consequently, ref clock 220 and divider output 222 may not have exactly equal frequencies during the locked state. The predetermined amount of time, and, therefore, the accuracy of output clock 221, may be determined during design of clock generation circuit 200 to establish an acceptable level of accuracy for intended uses of output clock 221.

It is noted that the embodiment of clock generation unit 200 as illustrated in FIG. 2 is merely an example. The illustration of FIG. 2 has been simplified to highlight features relevant to this disclosure. Various embodiments may include different configurations of the circuit bocks, including additional circuit blocks. Furthermore, although a PLL is used in the examples, the features described may apply to any suitable embodiment of a closed loop clock generation unit, such as, e.g., a DLL.

Figure 3:
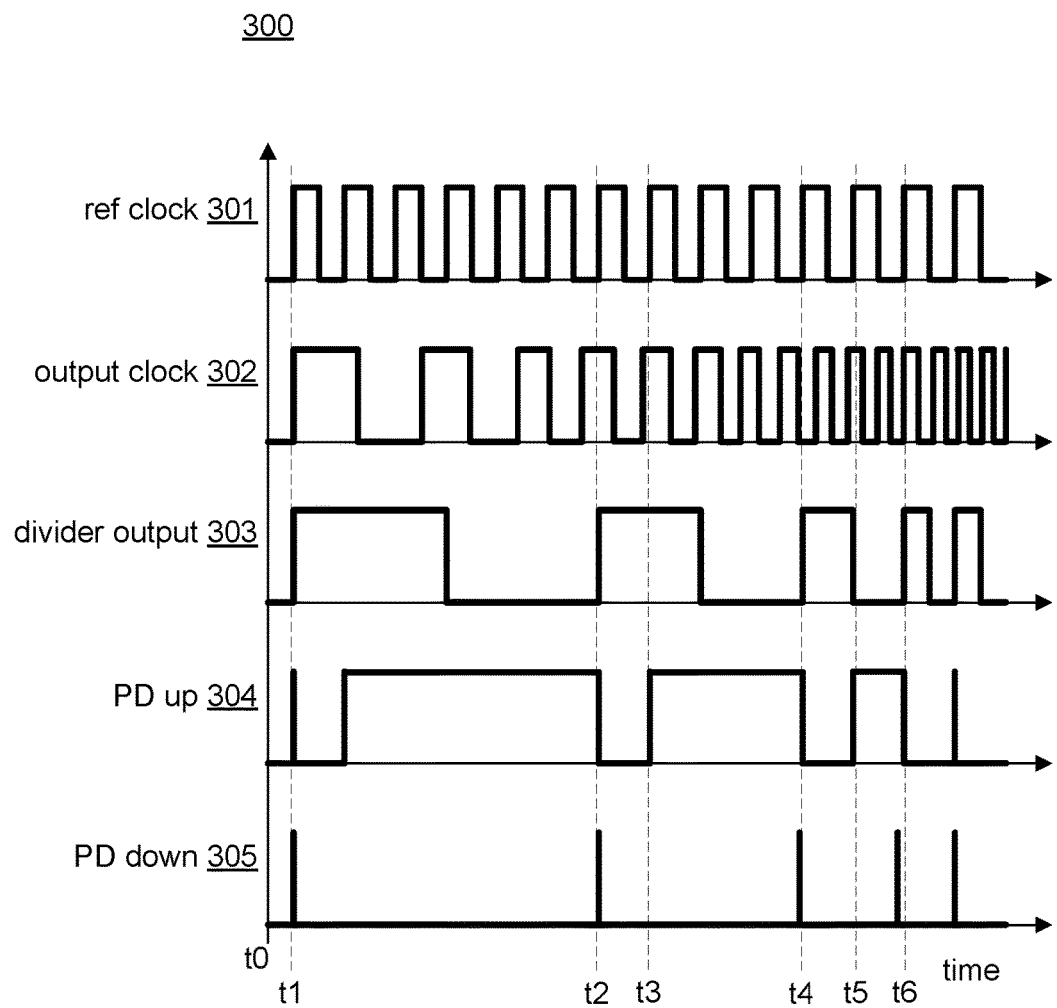
FIG. 3 shows a first timing diagram illustrating possible waveforms of an embodiment of a clock generation circuit.
Figure 4:
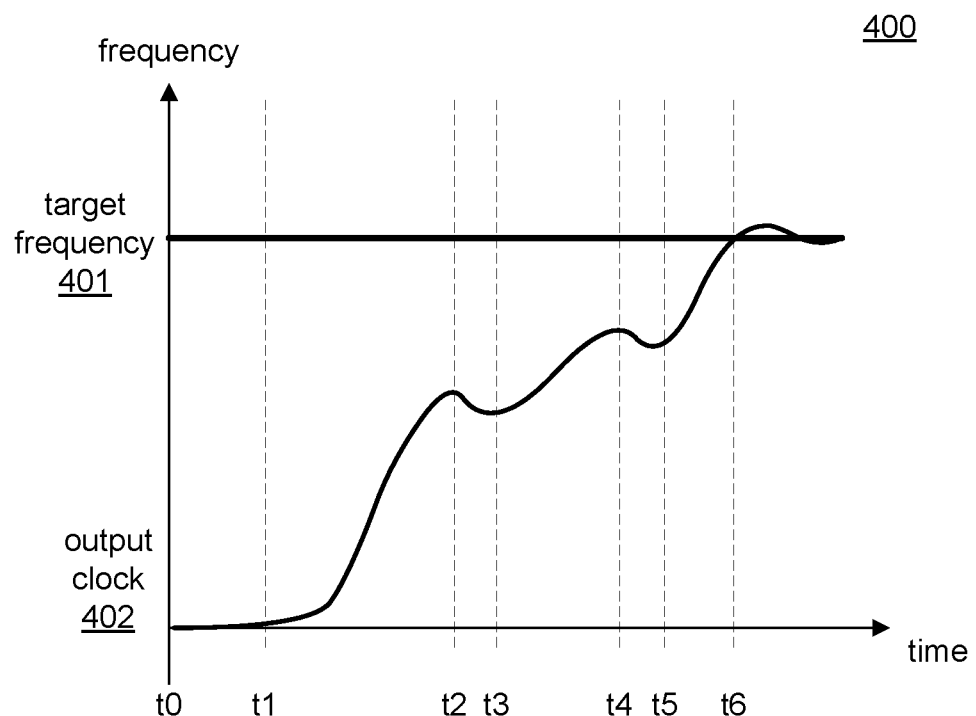
FIG. 4 illustrates a first chart showing an example of output frequency versus time of an embodiment of a clock generation circuit.

Moving to FIGS. 3 and 4, FIG. 3 shows a timing diagram including possible waveforms associated with an embodiment of clock generation circuit 200 presented in FIG. 2. The waveforms of timing diagram 300 illustrate voltage or logic levels versus time for various signals shown in FIG. 2. Referring collectively to FIG. 2 and FIG. 3, timing diagram 300 includes waveforms ref clock 301, output clock 302, divider output 303, PD up signal 304, and PD down signal 305. FIG. 4 illustrates a chart representing frequency of output clock 222 versus time. Chart 400 includes waveforms target frequency 401 and output clock 402. The waveforms in FIGS. 3 and 4 may correspond to the similarly named signals in FIG. 2. It is noted that both output clock 302 and output clock 402 correspond to output clock 521.

Referring collectively to clock generation circuit 200, timing diagram 300, and chart 400, the signals begin at t0. At time t0, all signals are low. The frequency of output clock 402 is lower than target frequency 401. The frequency of output clock 402 may be lower than target frequency 401 for various reasons, such as, for example, Clock Generation Circuit 500 may have been recently enabled after a reset or power on event.

At time t1, a rising edge occurs on both ref clock 301 and divider output 303. In the illustrated embodiment, both PD up signal 304 and PD down signal 305 briefly transition high and then return to a logic low. In other embodiments, only one of PD up signal 304 and PD down signal 305 may transition high, or neither may transition. At the next rising edge of ref clock 301, divider output 303 remains high and as a result, PD up signal 304 transitions high while PD down signal 305 remains low. This high value on PD up signal 304 and low value on PD down signal 305 may cause Charge Pump 203 to source current to its output, thereby charging capacitors within LPF 205. The charging capacitors in LPF 205 cause a corresponding increase in the voltage level of LPF output signal 228, which, in turn, causes VCO 207 to increase the frequency of output clock 402, as shown in chart 400.

PD up signal 304 remains high until the next rising edge of divider output 303 at time t2, at which time PD down signal 305 briefly transitions high, causing both PD up signal 304 and PD down signal 305 to transition low. The low values of both PD up signal 304 and PD down signal 305 may cause Charge Pump 203 to cease sourcing current to LPF 205. Due to the sudden loss of current from Charge Pump 203, capacitors in LPF 205 enter a charge redistribution state which causes the voltage level of LPF output signal 228 to fall. This fall in the voltage level of LPF output signal 228 may result in a corresponding reduction in the frequency of output clock 402.

The next rising edge of ref clock 301 at time t3 causes PD up signal 304 to transition high, again resulting in current being sourced from Charge Pump 203 to LPF 205. As LPF 205 receives the charge, the voltage level of LPF output signal 228 increases, thereby causing increases in the frequencies of output clock 402 and divider output 303.

At time t4, another rising edge occurs on divider output 303, causing PD down signal 305 to transition high. The transition on PD down signal 305 causes both PD up signal 304 and PD down signal 305 to transition low again. As a result, Charge Pump 203 again ceases charging of LPF 205 which again leads to charge redistribution in LPF 205 and a corresponding reduction in the frequency of output clock 402.

The next rising edge of ref clock 301 at time t5 results in PD up signal 304 transitioning high again, resulting in Charge Pump 203 resuming charging of LPF 205. The voltage level of LPF output signal 228 increases, resulting in an increase in the frequency of output clock 302. By time t6, both ref clock 301 and divider output 303 are running at similar frequencies. Neither PD up signal 304 nor PD down output 304 may transition high for very long, and clock generation circuit 200 may be considered locked.

It is noted that in the example of FIGS. 3 and 4, that the frequency of output clock 402 increases in increments, with periods of decreasing frequency when both PD up signal 304 and PD down signal 305 are low. These periods when output clock 402 decreases may correspond to occurrences of cycle slip causing charge redistribution. Occurrences of cycle slip may contribute to delays in clock generation circuit 200 reaching a locked state.

It is also noted that timing diagram 300 of FIG. 3 and chart 400 of FIG. 4 merely illustrate examples of signals resulting from one embodiment of clock generation circuit 200. The signals are simplified to provide clear descriptions of the disclosed concepts. In various embodiments, the signals may appear different due various influences such as technology choices for building the circuits, actual circuit design and layout, ambient noise in the environment, choice of power supplies, etc. Additionally, the relationship between times t0 through t6 between FIG. 3 and FIG. 4 are not intended to be to scale. In other embodiments, changes in the frequency of output clock 302(402) may occur at different rates than illustrated.

Figure 5:
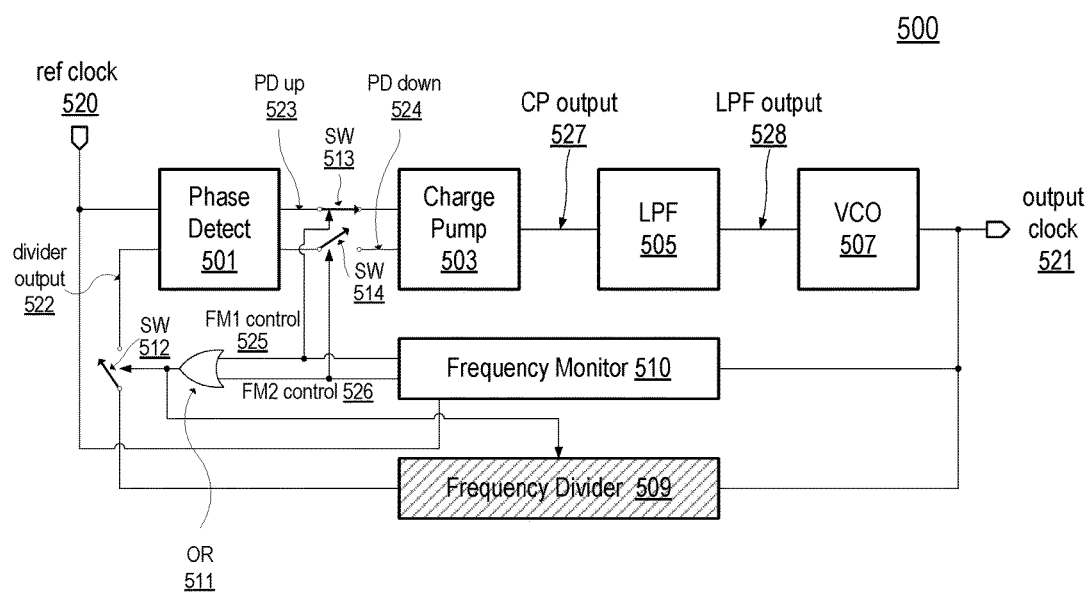
FIG. 5 illustrates a block diagram of a second embodiment of a clock generation circuit.

Turning now to FIG. 5 a block diagram of a second embodiment of a clock generation circuit is shown. Clock Generation Circuit 500 may be included in Clock Generation Circuit 105 in FIG. 1. Clock Generation Circuit 500 includes Phase Detect 501 coupled to switch (SW) 513 via PD up signal 523 and to switch (SW) 514 via PD down signal 524. Both switch 513 and switch 514 are coupled to Charge Pump 503 which is then coupled to low pass filter (LPF) 505. LPF 505 is coupled to voltage controlled oscillator (VCO) 507, which is then coupled to Frequency Divider 509. An output of Frequency Divider 509 (divider output 522) is coupled to switch (SW) 512. Frequency Monitor 510 is coupled to OR gate 511 and switches (SW) 513 and 514. OR gate 511 is coupled to switch (SW) 512 and Frequency Divider 509. Clock Generation Circuit 500 receives reference clock (ref clock) 520 as an input to Phase Detect 501 and generates output clock 521 from VCO 507. In the illustrated embodiment, the circuit blocks in FIG. 5 operate as described above in regards to the similarly named circuit blocks in FIG. 2, except as noted below.

In the illustrated embodiment, Frequency Monitor 510 receives output clock 521 and ref clock 520. Frequency Monitor 510 compares a frequency of output clock 521 to a frequency of ref clock 520. In some embodiments, Frequency Monitor 510 includes a counter circuit and increments a count value for each detected rising edge of output clock 521 beginning at a start of a comparison cycle. In some embodiments, this count value is captured and then reset upon detecting an end of the comparison cycle. In other embodiments, the count value may continue to increment while a previously captured count value is subtracted from the current count value to determine a number of clock edges detected during the most recent comparison cycle. In various embodiments, a comparison cycle may correspond to one period of ref clock 520, or multiple cycles of ref clock 520. Periods of ref clock 520 may be determined by detecting rising or falling edges of ref clock 520.

Although a counter circuit is included in the illustrated embodiment, Frequency Monitor 510 may be implemented using any suitable circuit. For example, in other embodiments, Frequency Monitor 510 may include delay circuits, and/or frequency filters.

Depending on settings for clock generation circuit 500, output clock 521 runs at a frequency that is a certain multiple of ref clock 520. If the count value remains below a first threshold value for a complete comparison cycle, then the frequency of output clock 521 may be lower than a target frequency. If the count value increases above a second threshold value within a comparison cycle, then the frequency of output clock 521 may be higher than the target frequency. If the count value is between the first and second thresholds for a comparison cycle, then the frequency of output clock 521 may be within a predetermined range of the target frequency.

For example, Clock Generation Circuit 500 may be set to generate output clock 521 at a frequency 32 times higher than ref clock 520. In such an embodiment, Frequency Monitor 510 would be expected to count approximately 32 rising edges (or falling edges in other embodiments) of output clock 521 during a complete comparison cycle, when clock generation circuit is operating in a locked state. In such an example, the first threshold value may be set at 26 and the second threshold set at 38.

Frequency Monitor 510, in one embodiment, asserts FM1 control signal 525 when the count value is reset and the count value for a comparison cycle is below the first threshold value. In some embodiments, Frequency Monitor 510 asserts FM2 control signal 526 if the count value exceeds the second threshold value. If the count value falls between the first and second threshold values for a comparison cycle, then the control signals are de-asserted.

When FM1 control signal is asserted, switches 512 and 514 are opened and switch 513 remains closed. Opening switch 512, via the output of OR 511, decouples Phase Detect 501 from Frequency Divider 509, such that Phase Detect 501 receives ref clock 520 but not divider output 522. Operation of Clock Generation Circuit 500 with switch 512 open is referred to herein as an "open-loop mode of operation," or simply "open-loop mode." As a result of being decoupled from divider output 522, Phase Detect 501 asserts PD up signal 523. PD up signal 523 may remain asserted for as long as FM1 control signal 525 remains asserted. The assertion of PD up signal 523 may cause Charge Pump 503 to charge LPF 505, driving LPF output signal 528 to a high voltage level causing, in turn, VCO 507 to generate output clock 521 at ever increasing frequencies.

Output clock 521 eventually reaches a high enough frequency to cause the count value in Frequency Monitor 510 to exceed the first threshold value (while remaining below the second threshold value) and, subsequently, cause Frequency Monitor 510 to de-assert FM1 control signal 525. In response to the de-assertion of FM1 control signal 525, switches 512 and 514 are closed and Clock Generation Circuit 500 may operate as described in regards to clock generation circuit 200 in FIG. 2. Operation of Clock Generation Circuit 500 with switch 512 closed is referred to herein as a "closed-loop mode of operation," or simply "closed-loop mode."

In the illustrated embodiment, when FM2 control signal 526 is asserted, switches 512 and 513 are opened and switch 514 remains closed. Phase Detect 501 generates a high signal on PD down signal 524 causing Charge Pump 503 to discharge LPF 505, which causes the voltage level of LPF output 528 to fall. The falling voltage level of LPF output 528 is received by VCO 507, resulting in VCO 507 generating output clock 521 at gradually lower frequencies. Once the frequency of output clock 521 falls to a point that the count value in Frequency Monitor 510 is between the first and second threshold values, FM2 control 526 is de-asserted and switches 512 and 513 are closed. Clock Generation Circuit 500 may return to operating as described for clock generation circuit 200.

In some embodiments, while either FM1 control signal 525 or FM2 control signal 526 are asserted, Frequency Divider 509 may be placed into a reduced power mode or disabled to reduce power consumption, as indicated by the shading in FIG. 5. Since divider output 522 is decoupled from Phase Detect 501 while either control signal is asserted, operation of Frequency Divider 509 is not being used and may be halted to conserve power.

It is noted that by monitoring the frequency of output clock 521 and influencing the signals received by VCO 507, an amount of time used for acquiring lock from an unlocked state may be reduced. In the embodiment of Clock Generation Circuit 500, inputs to Charge Pump 503 are controlled to influence the input to VCO 507.

It is also noted that FIG. 5 is merely an example of a clock generation circuit. Other methods of monitoring a clock frequency than described for Frequency Monitor 510 may be utilized in other embodiments.

Figure 6:
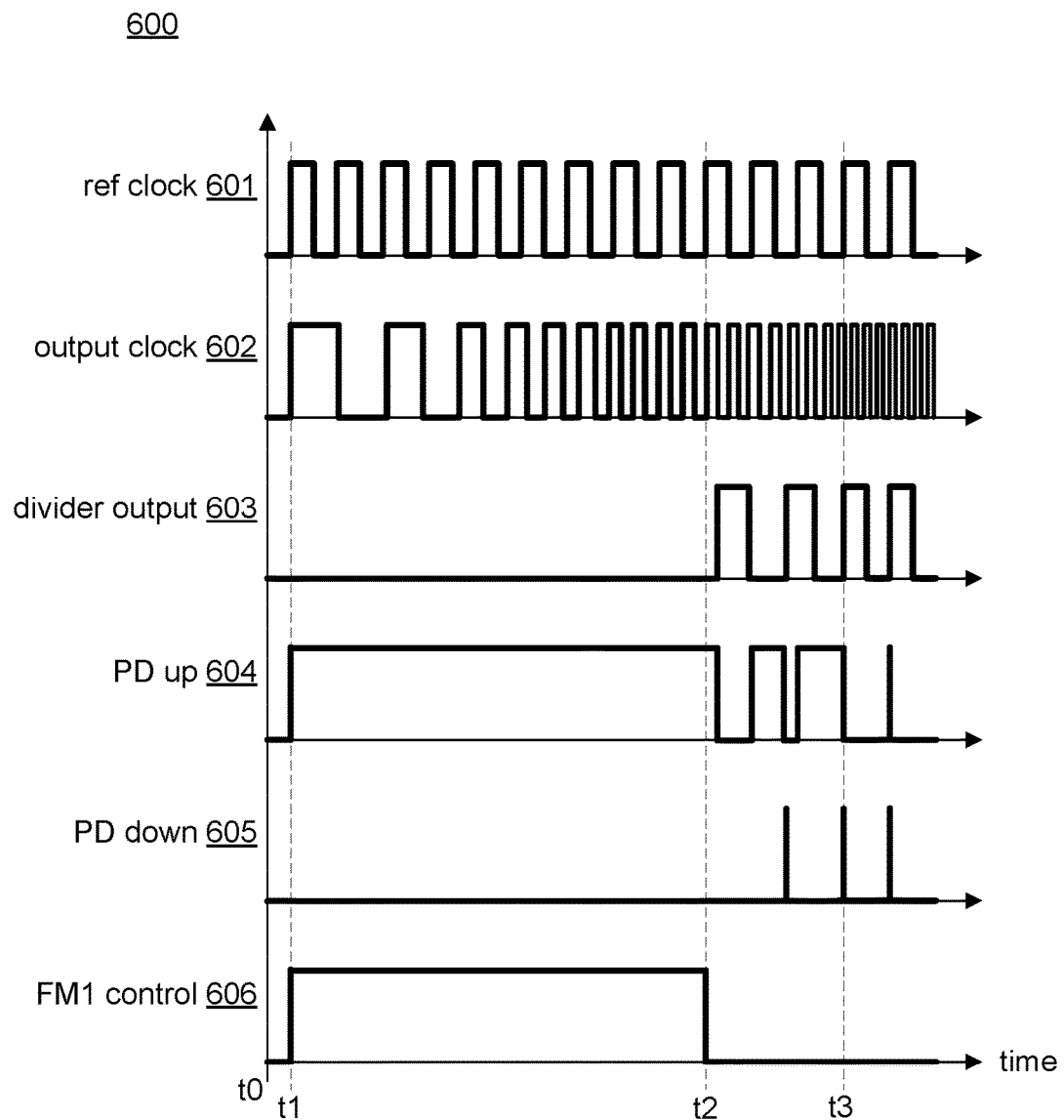
FIG. 6 depicts a second timing diagram illustrating possible waveforms of an embodiment of a clock generation circuit.
Figure 7:
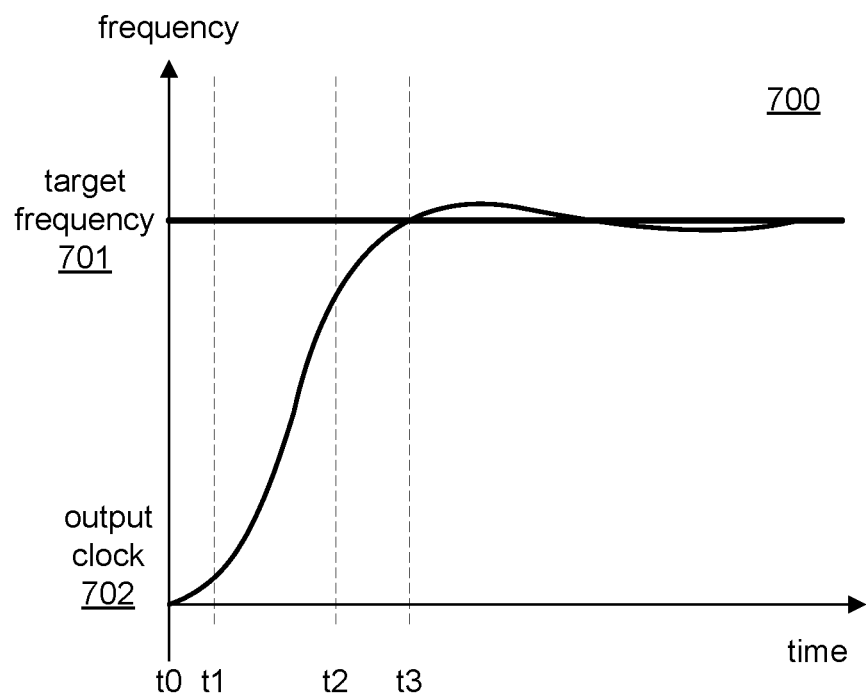
FIG. 7 shows a second chart illustrating an example of output frequency versus time of an embodiment of a clock generation circuit.

Moving now to FIGS. 6 and 7, FIG. 6 depicts a timing diagram including possible waveforms associated with an embodiment of a clock generation circuit, such as, e.g., Clock Generation Circuit 500 in FIG. 5. In the illustrated embodiment, timing diagram 600 and chart 700 include waveforms associated with ref clock 520, output clock 521, divider output 522, PD up signal 523, PD down signal 524, and FM1 control signal 525. Similar to timing diagram 300 in FIG. 3, the waveforms of timing diagram 600 illustrate voltage or logic levels versus time and include ref clock 601, output clock 602, divider output 603, PD up signal 604, PD down signal 605, and FM1 control signal 606. FIG. 7 illustrates a chart representing frequency versus time. Chart 700 includes waveforms target frequency 701 and output clock 702. The waveforms in FIGS. 6 and 7 may correspond to the similarly named signals in FIG. 5. It is noted that both output clock 602 and output clock 702 correspond to output clock 521, with 602 showing voltage versus time and 702 illustrating frequency versus time.

Referring collectively to clock generation circuit 500, timing diagram 600, and chart 700, the signals begin at t0. In the illustrated embodiment, Clock Generation Circuit 500 receives settings to generate output clock 702 at target frequency 701. At time t0, all signals are low. The frequency of output clock 702 is much lower than target frequency 701. The frequency of output clock 702 may be lower than target frequency 701 for various reasons, such as, for example, one or more settings for Clock Generation Circuit 500 may have been recently changed to increase the frequency of output clock 702.

At time t1, a rising edge occurs on ref clock 601. In one embodiment, the rising edge of ref clock 601 may correspond to an end of a comparison cycle in Frequency Monitor 510. The count value is below the first threshold value, as described above in regards to FIG. 5, which corresponds to output clock 702 running at a lower frequency than target frequency 701. In response to the determination that that output clock 702 is running at too low of a frequency, Frequency Monitor 510 assert FM1 control signal 606 which decouples divider output 603 from Phase Detect 501 by opening switch 512. In addition, switch 514 may be opened to decouple Charge Pump 503 from PD down signal 524. In the illustrated example, divider output 603 did not transition high before being decoupled from Phase Detect 501, PD up signal 604 transitions high in response to the rising edge of ref clock 601.

While FM1 control signal 606 is asserted, Clock Generation Circuit 500 operates in open-loop mode. In open-loop mode, divider output 603 is decoupled from Phase Detect 501, and PD up signal 604, therefore, remains asserted as Phase Detect 501 is isolated from rising edges generated by Frequency Divider 509. In some embodiments, as previously described, Frequency Divider 509 may be disabled or powered down while FM1 control signal 606 is asserted. Frequency Monitor 510 continues to monitor output clock 602. The asserted value of PD up signal 604 causes Charge Pump 503 to gradually charge LPF 505. LPF 505 subsequently increases the voltage level of its output signal to VCO 507, resulting in the frequency of output clock 602 (702) to increase over time, as shown between time t1 and time t2 in both timing diagram 600 and chart 700. It is noted that while referred to herein as "open-loop" mode while FM1 control signal 606 is asserted, Phase Detect 501 receives feedback via Frequency Monitor 510, in what may be considered an alternate feedback closed-loop. For the purposes of this disclosure, "open-loop" mode includes modes in which feedback is received via Frequency Monitor 510 and "closed-loop" mode refers to modes of operation in which feedback is received via Frequency Divider 509.

A rising edge on ref clock 601 at time t2, in the illustrated embodiment, may signal an end to a comparison cycle in which the count value is greater than the first threshold value and less than the second threshold value, indicating that the frequency of output clock 702 is within a predetermined range of target frequency 701. Frequency Monitor 510, in response to this indication, de-asserts FM1 control signal 606. The de-assertion of FM1 control signal 525 caused switches 512 and 514 to close, putting Clock Generation Circuit 500 into closed-loop mode. Frequency Divider 509 generates divider output 603, which is now coupled to Phase Detect 501. In closed-loop mode, operation of Clock Generation Circuit 500 may correspond to the description of clock generation circuit 200 in FIG. 2 with the exception that since the frequency of output clock 602 is within the predetermined range of target frequency 701, cycle slips may be avoided.

It is noted that in the example of FIG. 7, that the frequency of output clock 702 increases more consistently than is shown for output clock 402 in FIG. 4. In the example of FIG. 7, no instances of cycle slip are illustrated which may contribute to a decreased amount of time for Clock Generation Circuit 500 to reach a locked state.

It is also noted that timing diagram 600 of FIG. 6 and chart 700 of FIG. 7 are examples of possible signals resulting from one embodiment of clock generation circuit 500. The signals are simplified to clearly demonstrate the disclosed concepts. For example, the frequency of output clock 602 is not intended to be in scale with ref clock 601 or divider output 603. In addition, the relationship between times t0 through t4 between FIG. 3 and FIG. 4 are not intended to be to scale. In other embodiments, changes in the waveforms of output clock 602 and 702 may occur at different rates than illustrated.

Figure 8:
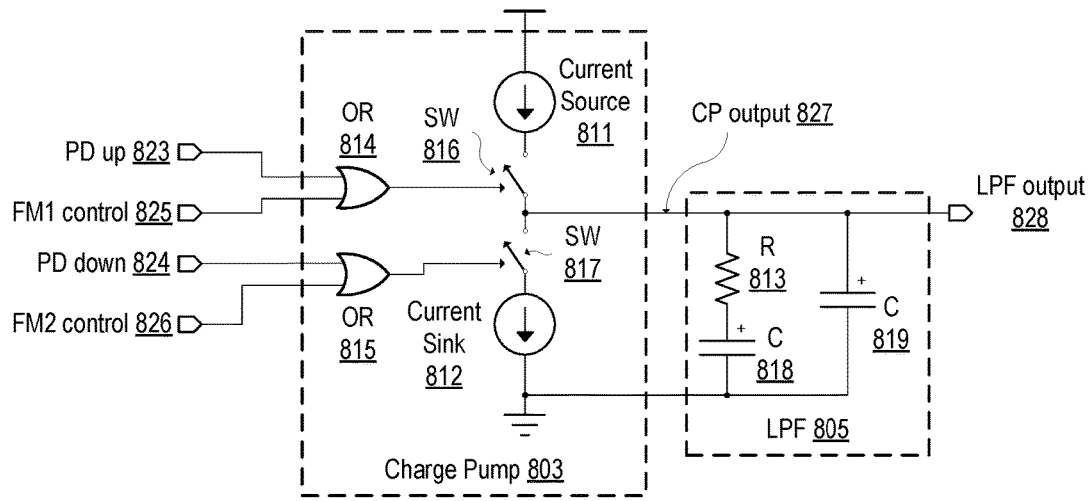
FIG. 8 depicts an example circuit for an embodiment of a charge pump and a low pass filter.

Turning to FIG. 8, an example circuit for an embodiment of a charge pump and low pass filter is illustrated. Charge pump 803 and low pass filter (LPF) 805, in the illustrated embodiment, are part of a closed loop clock circuit, such as, for example, Clock Generation Circuit 900 in FIG. 9, described below. Charge Pump 803 includes Current Source 811, Current Sink 812, OR logic gates (OR) 814 and 815, and switches (SW) 816 and 817. Charge Pump 803 receives input signals PD up signal 823, PD down signal 824, FM1 control signal 825, and FM2 control signal 826, and generates CP output signal 827 dependent upon the received input signals. Low pass filter (LPF) 805 includes resistor (R) 813 and capacitors (C) 818 and 819. LPF 805 receives CP output 827 and generates LPF output 828.

In the illustrated embodiment, Charge Pump 803 operates by coupling Current Source 811 and decoupling Current Sink 812 from CP output 827 to increase an amount of charge provided to LPF 805. The charge is stored in C 818 and C 819, thereby increasing a voltage level of LPF output 828. While accumulating charge, the voltage level across C 818 may be lower than across C 819 due to a voltage drop across R 813. When CP output 827 remains at a constant voltage level, the voltage level across C 818 may reach the voltage level across C819 as both capacitors reach their respective charge capacity. It is noted that, in the illustrated embodiment, CP output 827 and LPF output 828 are signals on a same node, and therefore, are equivalent signals.

Current Source 811 is decoupled and Current Sink 812 coupled to LPF 805 to decrease the amount of charge stored in C 818 and C 819, thereby lowering the voltage level of LPF output 828. While discharging via Current Sink 812, the voltage level across C 819 may fall faster than across C 818, again due to R 813. In one embodiment, during operation of the clock generation circuit, C 819 stores and releases charge faster than C 818. At some points in time, charge from C 819 may be provided to C 818, and vice versa at other points in time. The faster this redistribution of charge occurs, the faster the clock generation circuit may be able to achieve lock.

Input signals PD up signal 823 and FM1 control signal 825, in the illustrated embodiment, are received by OR 814 to generate a control signal for SW 816. When closed, SW 816 couples Current Source 811 to LPF 805. Assertion of either PD up signal 823 or FM1 control signal 825, therefore, causes the voltage level of CP output 827 to increase. De-assertion of both PD up signal 823 and FM1 control signal 825, on the other hand, decouples Current Source 811 from LPF 805, disabling charging of C 818 and C 819.

Similarly, input signals PD down signal 824 and FM2 control signal 826 are received by OR 815 to generate a control signal for SW 817. SW 817 couples Current Sink 812 to LPF 805 when closed and decouples Current Sink 812 from LPF 805 when open. Consequently, assertion of either PD down signal 824 or FM2 control signal 826 causes the voltage level of CP output 827 to decrease, while de-assertion of both PD down signal 824 and FM2 control signal 826 decouples Current Sink 812 from LPF 805, thereby discharging or disabling discharging, respectively, of C 818 and C 819.

In some embodiments, Current Source 811 and SW 816 may be implemented as a single transistor, or other type of transconductance device. Current Sink 812 and SW 817 may be similarly implemented.

It is noted that Charge Pump 803 and LPF 805 are merely examples of a charge pump circuit and low pass filter circuit, respectively. In other embodiments, various circuit changes may be employed. For example, in one embodiment, switches SW 816 and SW 817 may be removed and current sources 801 and 802 may receive control signals directly.

Figure 9:
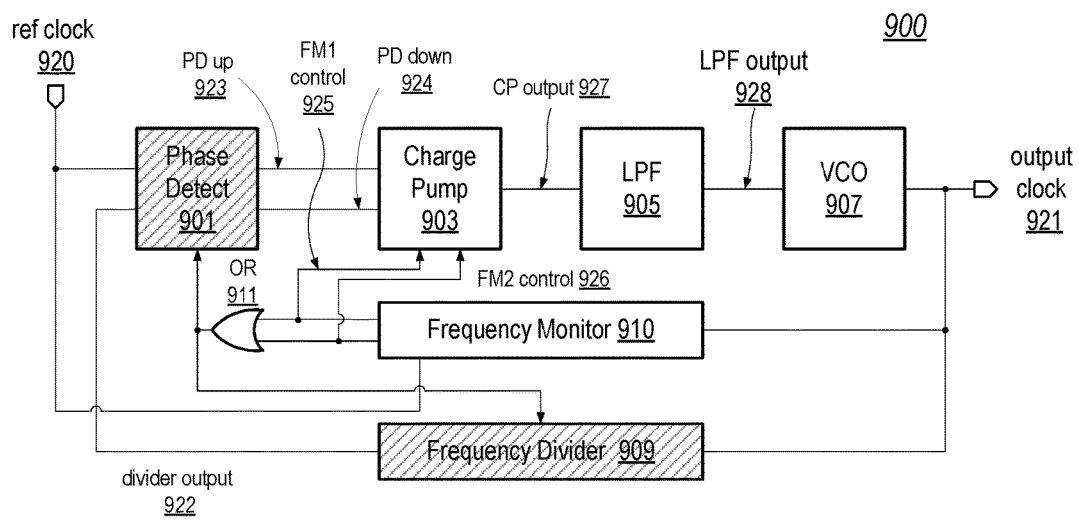
FIG. 9 shows a block diagram of a third embodiment of a clock generation circuit.

Moving to FIG. 9, a block diagram of a third embodiment of a clock generation circuit is shown. In various embodiments, Clock Generation Circuit 900 may be included in Clock Generation Circuit 105 in FIG. 1. Clock Generation Circuit 900 includes Phase Detect 901 coupled to Charge Pump 903, which is coupled to low pass filter (LPF) 905. LPF 905 is coupled to voltage controlled oscillator (VCO) 907, which is then coupled to Frequency Divider 909 and Frequency Monitor 910. An output of Frequency Divider 909 (divider output 922) is coupled to Phase Detect 901. Two outputs of Frequency Monitor 910 (FM1 control signal 925 and FM2 control signal 926) are received by OR gate (OR) 911, the output of which is coupled to Phase Detect 901 and Frequency Divider 909. Clock Generation Circuit 900 receives reference clock (ref clock) 920 as an input to Phase Detect 901 and generates output clock 921 from VCO 907.

In the illustrated embodiment, Clock Generation Circuit 900 includes functional circuits that are similar to similarly named and numbered circuits in clock generation circuit 200 in FIG. 2. Functional descriptions of common circuits may be as described above in regards to FIG. 2, except where noted below. Clock Generation Circuit 900 may operate in both open-loop and closed-loop modes. When operating in the closed-loop mode, operation is similar the description of clock generation circuit 200.

Frequency Monitor 910, in one embodiment, generates a count value by counting a number of rising or falling edges of output clock 921 during a comparison cycle. Similar to Frequency Monitor 510 in FIG. 5, a comparison cycle may be determined by one or more periods of ref clock 920. Frequency Monitor 910 asserts output signals FM1 control signal 925 or FM2 control signal 926 depending on if the count value, upon completion of a comparison cycle, is below a first threshold value, or above a second threshold value. Neither FM1 control signal 925 nor FM2 control signal 926 may be asserted if the count value is between the first and second threshold values. As described above in regards to Frequency Monitor 510, Frequency Monitor 910 may be implemented with any suitable circuit.

Charge Pump 903 receives FM1 control signal 925 and FM2 control signal 926 from Frequency Monitor 910. In some embodiments, Charge Pump 903 corresponds to charge Pump 803 in FIG. 8. While Clock Generation Circuit 900 operates in closed-loop mode, FM1 control signal 925 and FM2 control signal 926 are both de-asserted and Charge Pump 903 adjust the current sourced or sunk on CP output 927 dependent upon PD up signal 923 and PD down signal 924 generated by Phase Detect 901.

If the frequency of output clock 921 is below the first threshold value or above the second threshold value, then either FM1 control signal 925 or FM2 control signal 926 is asserted, respectively, and the output of OR 911 is asserted. In response to the assertion, Phase Detect 901 and/or Frequency Divider 909, as indicated by the shaded boxes in FIG. 9, may be disabled or powered down, and Clock Generation Circuit 900 may operate in open-loop mode. In open-loop mode, Charge Pump 903 sources current to LPF 905 if FM1 control signal 925 is asserted, or sinks current from LPF 905 if FM2 control signal 926 is asserted. The sourcing or sinking of current causes LPF 905 and VCO 907 to respond as previously described in regards to FIGS. 2 and 5, and the frequency of output clock 921 may increase or decrease until the count value in Frequency Monitor 910 is between the first and second threshold values. In response to the count value being between the threshold values, both FM1 control signal 925 and FM2 control signal 926 may be de-asserted, causing the output of OR 911 to de-assert, and in turn, causing Phase Detect 901 and Frequency Divider 909 to be enabled, placing Clock Generation Circuit 900 back into closed-loop mode.

Waveforms for the signals of Clock Generation Circuit 900 when output clock signal 921 is below the first threshold value may be similar to the waveforms of FIGS. 6 and 7. Waveforms for PD up signal 923 and PD down signal 924, however, may differ from those shown in FIG. 6 during the time period between t1 and t2.

It is noted that OR gates are used in the illustrated embodiments, and represent one type of logic circuit. In other embodiments, other types of logic gates may be utilized.

It is noted that FIG. 9 is one example of a clock generation circuit. Other methods of monitoring a clock frequency than described for Frequency Monitor 510 may be utilized in other embodiments. For example, rather than counting up towards threshold values, other embodiments of frequency monitors may count down.

Figure 10:
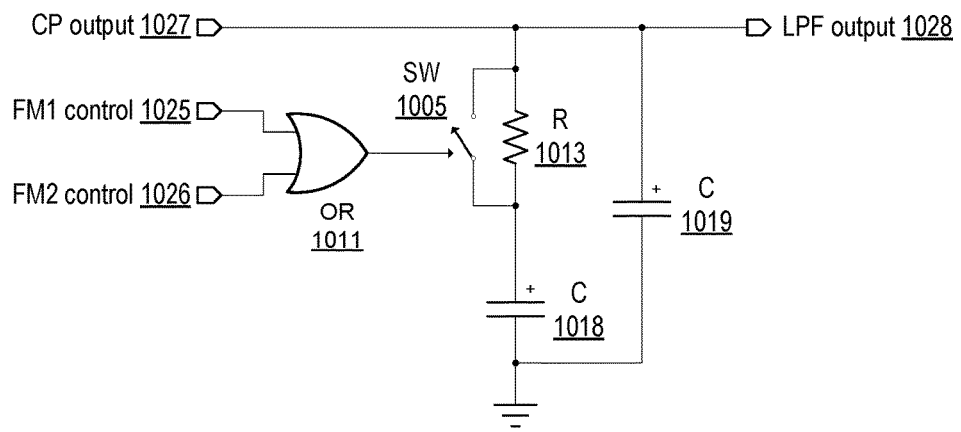
FIG. 10 illustrates another example circuit for an embodiment of a low pass filter.

Turning now to FIG. 10, another example circuit for an embodiment of a low pass filter is depicted. In one embodiment, Low Pass Filter 1000 includes capacitor C 1019 coupled in parallel with resistor R 1013 and capacitor C 1018. Switch SW 1005 is coupled in parallel with R 1013, and is operated by an output of OR logic gate (OR) 1011. Low pass filter 1000 receives input signals CP output 1027, FM1 control signal 1025, and FM2 control signal 1026. Low pass filter 1000 generates LPF output signal 1028 dependent upon the received input signals.

In the illustrated embodiment, when SW 1005 is open, Low Pass Filter 1000 operates similar to the description provided above regarding LPF 805 in FIG. 8. When FM1 control signal 1025 or FM2 control signal 1026 is asserted, the output of OR 1011 is asserted and SW1005 is closed. With SW 1005 closed, R 1013 is bypassed and C 1018 and C 1019 are driven to a same voltage level across their respective terminals. Current received via CP output 1027 charges both C 1018 and C 1019 such that the voltage level across their respective terminals remains equal. Charge is stored by each capacitor based on the respective capacitance value. For example, if both C 1018 and C 1019 have equal capacitance values, then each capacitor will store charge CP output 1027 at substantially the same rate.

As described for LPF 805, a change in current from CP output 1027 may result in charge redistribution between C 1018 and C 1019 when SW 1005 is open. By closing SW 1005 in response to an assertion of FM1 control signal 1025 or FM2 control signal 1026, any charge redistribution between C 1018 and C 1019 may occur faster than if SW 1005 remains open. Voltage level changes to the voltage level across C 1019 that are caused by a change in the current from CP output 1027 may also occur faster with SW 1005 closed, thereby resulting LPF output 1028 reacting faster than when SW 1005 is open.

In some embodiments, the aforementioned component values of C1018, C 1019, and R 1013 may be selected to achieve a desired cutoff frequency for LPF output 1028. As used herein, "cutoff frequency" corresponds to a frequency value at which Low Pass Filter 1000 attenuates LPF output 1028. For example, if Low Pass Filter 1000 is designed for a cutoff frequency of 100 kilohertz (kHz), then changes in current from CP output signal 1027 occurring at frequencies below 100 kHz may pass through to LPF output 1028, while frequencies of above 100 kHz may be attenuated. Generally speaking, the higher the frequency of changes on CP output signal 1027 is above the cutoff frequency, the less of CP output signal 1027 is passed through to LPF output signal 1028.

It is noted that low pass filter 1000 is an example circuit for demonstrating the disclosed concepts. Additional components may be included in some embodiments. Other suitable low pass filter designs may be utilized in other embodiments.

Figure 11:
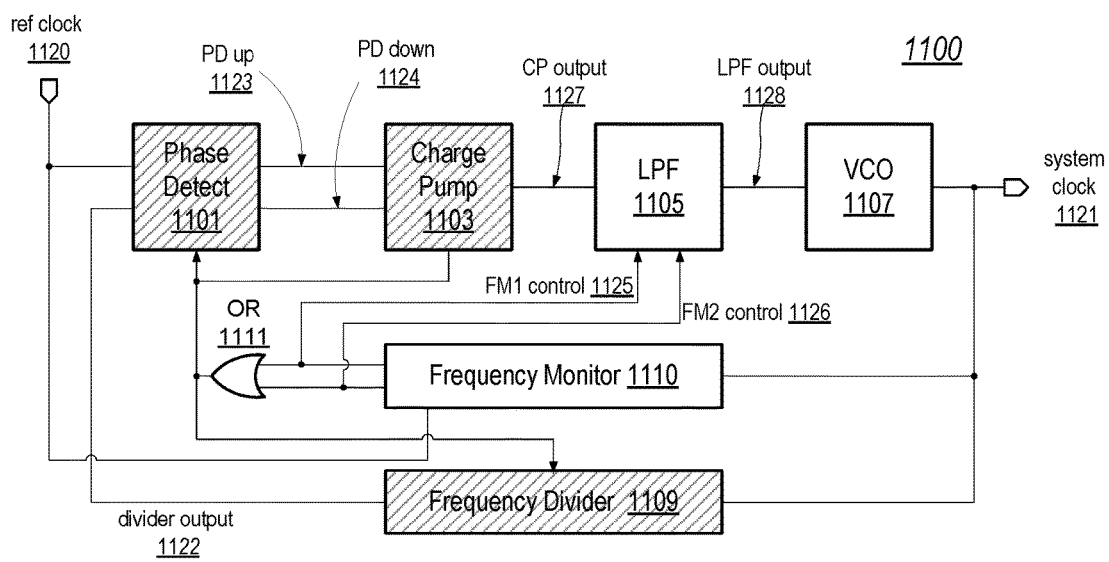
FIG. 11 depicts a block diagram of a fourth embodiment of a clock generation circuit.

Moving now to FIG. 11, a block diagram of a fourth embodiment of a clock generation circuit is shown. In various embodiments, Clock Generation Circuit 1100 may be included in Clock Generation Circuit 105 in FIG. 1. Clock Generation Circuit 1100 includes Phase Detect 1101 coupled to Charge Pump 1103 which is then coupled to low pass filter (LPF) 1105. LPF 1105 is coupled to voltage controlled oscillator (VCO) 1107, which is then coupled to Frequency Divider 1109 and Frequency Monitor 1110. An output of Frequency Divider 1109 (divider output 1122) is coupled to Phase Detect 1101. Two outputs of Frequency Monitor 1110 (FM1 control signal 1125 and FM2 control signal 1126) are coupled to OR gate (OR) 1111. Clock Generation Circuit 1100 receives reference clock (ref clock) 1120 as an input to Phase Detect 1101 and generates output clock 1121 from VCO 1107.

Clock Generation Circuit 1100 includes functional circuits that are similar to similarly named and numbered circuits in Clock Generation Circuit 900 in FIG. 9. Functional descriptions of common circuits may be as described above in regards to FIG. 9, except where noted below. Similar to clock generation circuit 900, Clock Generation Circuit 1100 may operate in both open-loop and closed-loop modes. When operating in the closed-loop mode, operation is similar the description of clock generation circuit 900.

Frequency Monitor 1110, in the illustrated embodiment, generates a count value as described for Frequency Monitor 910 in FIG. 9. Frequency Monitor 1110 asserts output signals FM1 control signal 1125 or FM2 control signal 1126 depending on if the count value, upon completion of a comparison cycle, is below a first threshold value, or above a second threshold value. Neither FM1 control signal 1125 nor FM2 control signal 1126 may be asserted if the count value is between the first and second threshold values.

LPF 1105, in one embodiment, corresponds to low pass filter 1000 in FIG. 10. When Frequency Monitor 1110 asserts FM1 control signal 1125 or FM2 control signal 1126, SW 1005 in LPF 1105 is closed, thereby allowing charge redistribution to occur faster between C 1018 and C 1019. The voltage level of LPF output 1128 reacts quickly to changes in the current from CP output 1127. VCO 1107 receives LPF output 1128 and increases or decreases the frequency of output clock 1121 in response to respective increases and decreases in the voltage level of LPF output 1128.

Additionally, assertion of FM1 control signal 1125 or FM2 control signal 1126 may cause one or more of Phase Detect 1101, Charge Pump 1103, and Frequency Divider 1109, as indicated by the shading in FIG. 11, to enter reduced power modes or to be disabled. If Charge Pump 1103 is placed in a reduced power mode or disabled, then CP output 1127 may be held at a high voltage level, such as, for example, by using a pull-up device to couple CP output 1127 to a power supply node such as VDD.

Waveforms for the signals of Clock Generation Circuit 1100 when output clock signal 1121 is below the first threshold value may be similar to the waveforms of FIGS. 6 and 7. Waveforms for PD up signal 1123 and PD down signal 1124, however, may differ from those shown in FIG. 6 during the time period between t1 and t2.

It is noted that Clock Generation Circuit 1100 is an example embodiment, and other variations are contemplated. In other embodiments, for example, OR gate 1111 may be omitted and both FM1 control signal 1125 and FM2 control signal 1126 may be received by Phase Detect 1101, Charge Pump 1103 and Frequency Divider 1109.

Figure 12:
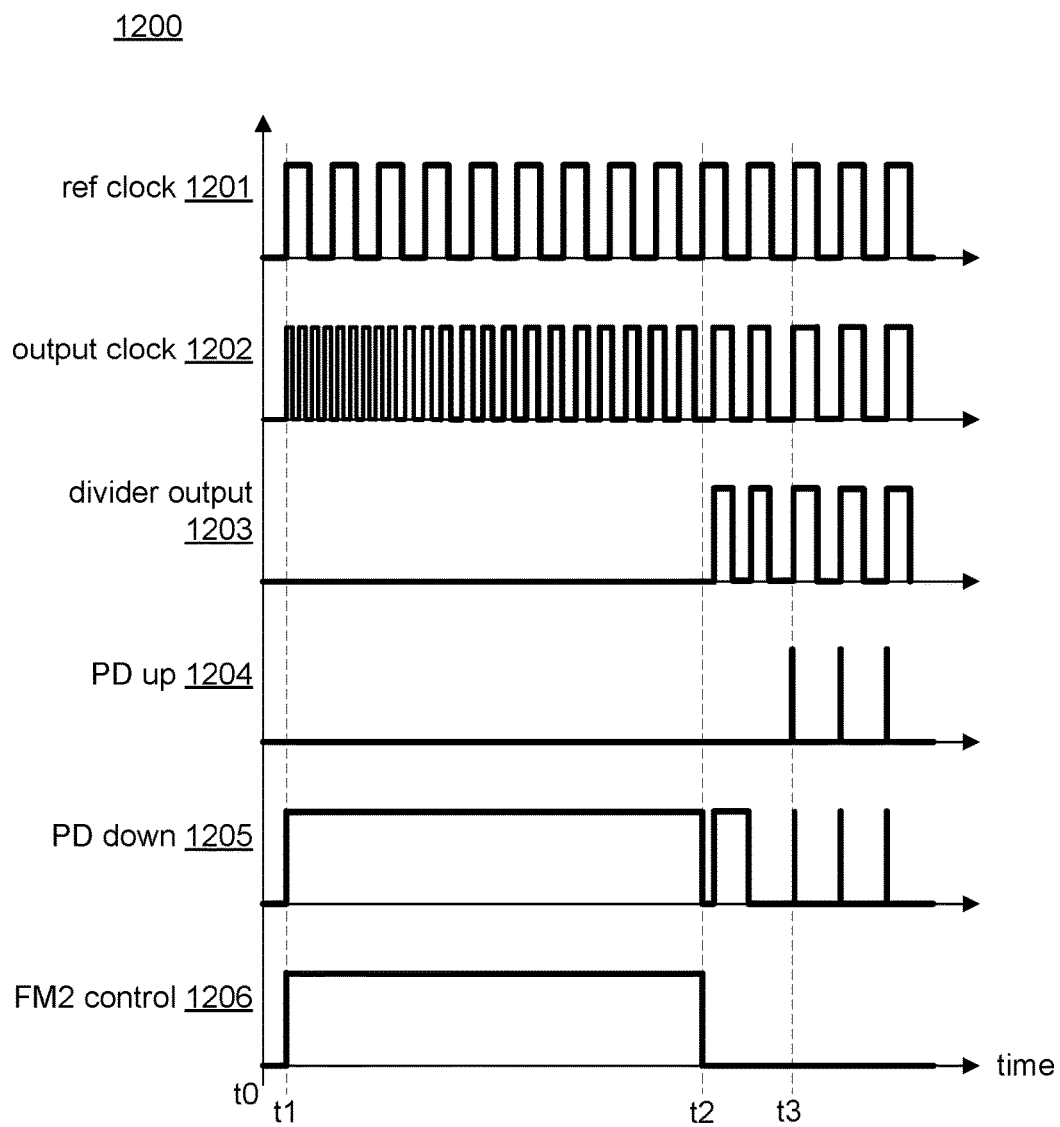
FIG. 12 illustrates a third timing diagram illustrating possible waveforms of an embodiment of a clock generation circuit.
Figure 13:
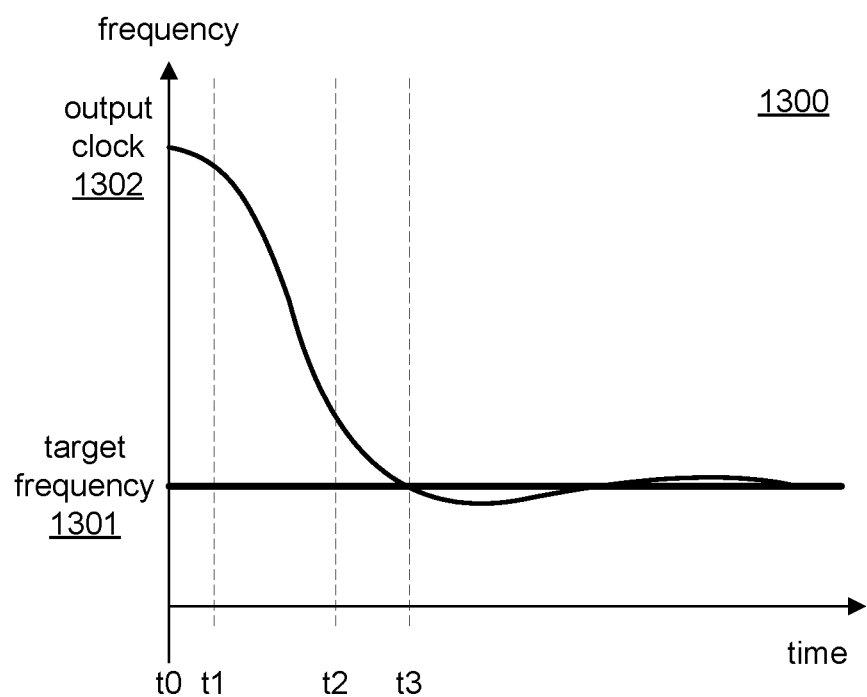
FIG. 13 shows a third chart illustrating an example of output frequency versus time of an embodiment of a clock generation circuit.

Turning to FIGS. 12 and 13, FIG. 12 shows a third timing diagram illustrating possible waveforms of an embodiment of a clock generation circuit such as, e.g., Clock Generation Circuit 500 in FIG. 5. In the illustrated embodiment, timing diagram 1200 and chart 1300 include waveforms associated with ref clock 520, output clock 521, divider output 522, PD up signal 523, PD down signal 524, and FM2 control signal 526. Similar to timing diagram 600 in FIG. 6, the waveforms of timing diagram 1200 illustrate voltage or logic levels versus time and include ref clock 1201, output clock 1202, divider output 1203, PD up signal 1204, PD down signal 1205, and FM1 control signal 1206. FIG. 13 depicts a chart representing frequency versus time. Chart 1300 includes waveforms target frequency 1301 and output clock 1302. The waveforms in FIGS. 12 and 13 may correspond to the similarly named signals in FIG. 5. It is noted that both output clock 1202 and output clock 1302 correspond to output clock 521, with 1202 showing voltage versus time and 1302 illustrating frequency versus time.

Referring collectively to clock generation circuit 500, timing diagram 1200, and chart 1300, the signals begin at t0. Clock Generation Circuit 500 may receive new settings to generate output clock 1302 at target frequency 1301, which is lower than a current frequency of output clock 1302. At time t0, all signals are low and the frequency of output clock 1302 is higher than target frequency 1301.

At time t1, a rising edge occurs on ref clock 1201. In the illustrated embodiment, the rising edge of ref clock 1201 may correspond to an end of a comparison cycle in Frequency Monitor 510. The count value is above the second threshold value, which corresponds to output clock 1302 running at a higher frequency than target frequency 1301. In response to this determination that that output clock 1302 is running at too high of a frequency, Frequency Monitor 510 assert FM2 control signal 1206 which causes divider output 1203 to be decoupled from Phase Detect 501 by opening switch 512. In addition, switch 513 may be opened to decouple Charge Pump 503 from PD up signal 523. In the illustrated example, divider output 1203 did not transition high before being decoupled from Phase Detect 501, PD down signal 1205 transitions high in response to the rising edge of ref clock 1201.

While FM2 control signal 1206 is asserted, Clock Generation Circuit 500 operates in open-loop mode with divider output 1203 decoupled from Phase Detect 501. PD down signal 1205, therefore, remains asserted as Phase Detect 501 is isolated from rising edges generated by Frequency Divider 509. In some embodiments, as previously described, Frequency Divider 509 may be disabled or powered down while FM2 control signal 1206 is asserted. Frequency Monitor 510 continues to monitor output clock 1202. The asserted value of PD down signal 1205 causes Charge Pump 503 to gradually decrease the voltage level of its output to LPF 505. LPF 505 subsequently decreases the voltage level of its output signal to VCO 507, resulting in the frequency of output clock 1202(1302) to decrease over time, as shown between time t1 and time t2 in both timing diagram 1200 and chart 1300.

In the illustrated embodiment, a rising edge on ref clock 1201 at time t2 may signal an end to a comparison cycle in which Frequency Monitor 510 determines that the count value is greater than the first threshold value and less than the second threshold value, indicating that the frequency of output clock 1302 is within a predetermined range of target frequency 1301. Frequency Monitor 510, in response to this indication, de-asserts FM2 control signal 1206. The de-assertion of FM2 control signal 1206 causes switches 512 and 513 to close, placing Clock Generation Circuit 500 into closed-loop mode. Frequency Divider 509 generates divider output 1203, which is now coupled to Phase Detect 501. In closed-loop mode, operation of Clock Generation Circuit 500 may correspond to the description of clock generation circuit 200 in FIG. 2 with the exception that since the frequency of output clock 602 is within the predetermined range of target frequency 1301, cycle slips may be avoided.

It is noted that in the example of FIG. 13, that the frequency of output clock 702 decreases smoothly. In the example of FIG. 13, no instances of cycle slip are illustrated, which may contribute to a decreased amount of time for Clock Generation Circuit 500 to reach a locked state.

It is also noted that timing diagram 1200 of FIG. 12 and chart 1300 of FIG. 13 are examples of signals resulting from an embodiment of clock generation circuit 500. The waveforms of FIGS. 12 and 13 may also correspond to other embodiments, such as, for example, Clock Generation Circuit 900 and Clock Generation Circuit 1100. In these other embodiments, some signals, e.g., PD up 1204 and PD down 1205, may differ from the waveforms shown. The illustrated signals are simplified for demonstrative purposes. For example, the frequency of output clock 1202 is not intended to be in scale with ref clock 1201 or divider output 1203.

Figure 14:
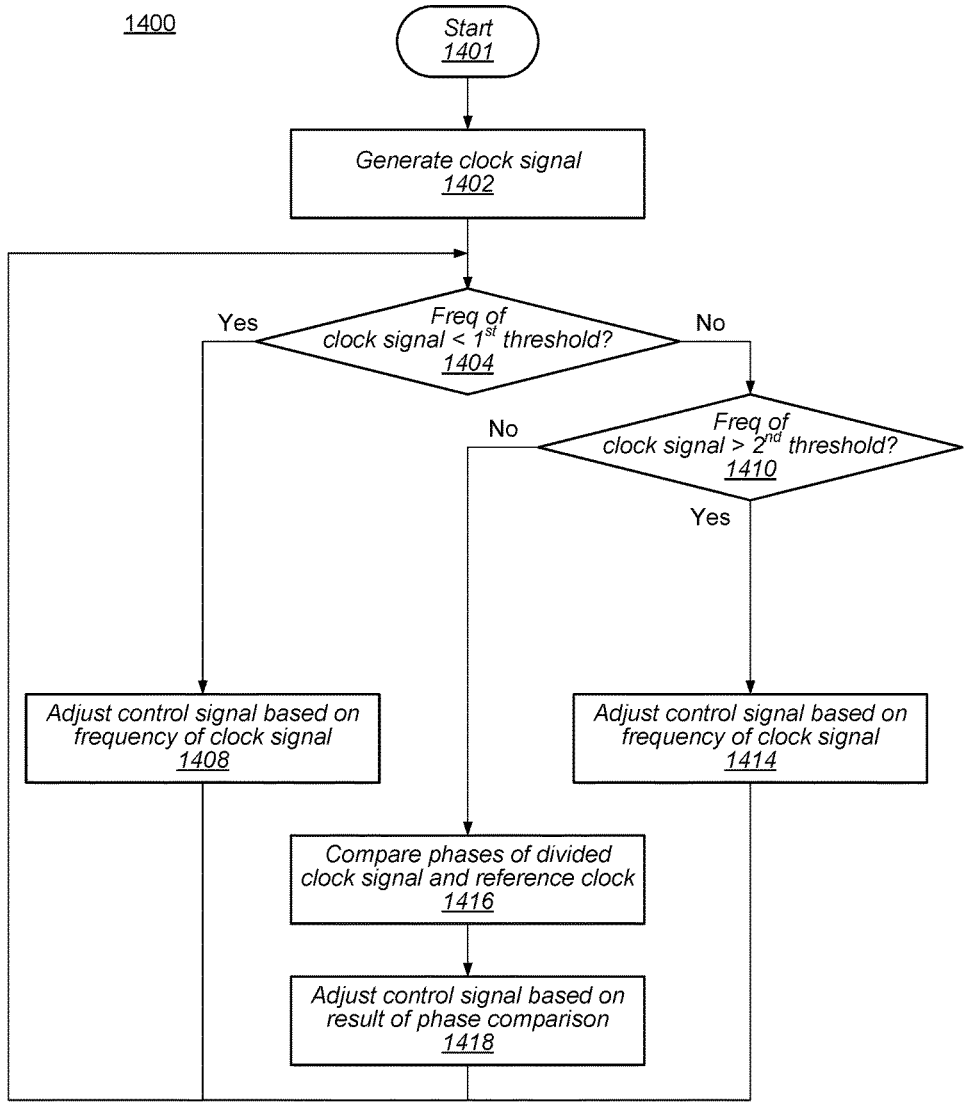
FIG. 14 illustrates a flow diagram of an embodiment of a method for operating a closed-loop clock generation circuit.

Moving to FIG. 14, a flow diagram of an embodiment of a method for operating a closed-loop clock generation circuit is illustrated. The method may be applied to a clock generation circuit, such as, for example, Clock Generation Circuit 500 in FIG. 5, Clock Generation Circuit 900 in FIG. 9, or Clock Generation Circuit 1100 in FIG. 11. Referring collectively to Clock Generation Circuit 500 and method 1400 in FIG. 14, the method may begin in block 1401.

A clock signal is generated (block 1402). Clock Generation Circuit 500, for example, may transition from a disabled state to an enabled state, in which case VCO 507 may begin generating output clock 521 with a default frequency. In other examples, Clock Generation Circuit 500 may be currently generating output clock 521 at a first frequency and then receive updated settings for generating output clock 521 at a second frequency. The frequency of output clock 521 may be determined by a voltage level of a control signal received by VCO 507, such as, e.g., LPF output 528 in the embodiment of FIG. 5.

Further operation of method 1400 may depend upon a frequency of the clock signal and a first threshold value (block 1404). In the illustrated embodiment of FIG. 5, Frequency Monitor 510 receives output clock 521 and measures its frequency in relation to a reference clock signal (ref clock 520). In one embodiment, Frequency Monitor 510 measures the frequency of output clock 521 by counting its rising or falling edges that occur between two rising or falling edges of ref clock 520. The two edges of ref clock 520 may indicate a beginning and an end to a given comparison cycle. In various embodiments, Frequency Monitor 510 may use a single period or multiple periods of ref clock 520 as a comparison cycle. The first threshold value may correspond to a lower frequency limit for Clock Generation Circuit 500 to operate in a closed-loop mode. The frequency of output clock 521 being lower than the first threshold value may indicate that Clock Generation Circuit 500 should operate in open-loop mode to reduce a time to acquire lock by increasing the frequency of output clock 521 more quickly than may be accomplished in closed-loop mode. If the frequency of output clock 521 is less than the first threshold value, then the method moves to block 1408 to adjust a control signal. Otherwise, the method moves to block 1410 to compare output clock 521 to a second threshold value.

If the frequency of the clock signal is less than the first threshold, then the control signal is adjusted based on the measured frequency of the clock signal (block 1408). Frequency Monitor 510 asserts FM1 control signal 525 if the frequency of output clock 521 is less than the first threshold. The assertion of FM1 control signal 525 causes Clock Generation Circuit 500 to operate in an open-loop mode. Open-loop mode operation may be enabled in different ways in various embodiments. For example, in the embodiment of FIG. 5, the assertion of FM1 control signal 525 results in divider output 522 being decoupled from Phase Detect 501 and PD down signal 524 being decoupled from Charge Pump 503. With divider output 522 decoupled, Phase Detect 501 asserts PD up signal 523, which is received by Charge Pump 503. Charge Pump 503 sources current through CP output signal 527 to LPF 505. The received charge in LPF 505 increases a voltage level of LPF output signal 528 which is received at a control input to VCO 507. The increased voltage level of LPF output signal 528 at the control input of VCO 507 causes VCO 507 to increase the frequency of output clock 521. The method may return to block 1404 to continue monitoring the clock signal.

If, in block 1404, it is determined that the frequency of the clock signal is less than the first threshold value, then further operations may depend upon a second threshold value (block 1410). The second threshold value may correspond to an upper frequency limit for Clock Generation Circuit 500 to operate in a closed-loop mode, and may, therefore, be set higher than the first threshold value. The frequency of output clock 521 being higher than the second threshold value may indicate that Clock Generation Circuit 500 should operate in open-loop mode to reduce a time to acquire lock by lowering the frequency of output clock 521 more quickly than may be achieved in closed-loop mode. If the frequency of output clock 521 is greater than the second threshold value, then the method moves to block 1414 to adjust the control signal. Otherwise, the method moves to block 1416 to compare phases of divider output signal 522 and ref clock 520.

If the frequency of the clock signal is greater than the second threshold, then the control signal is adjusted based on the measured frequency of the clock signal (block 1414). Frequency Monitor 510 asserts FM2 control signal 526. Similar to FM1 control signal 525 in block 1408, the assertion of FM2 control signal 526, causes Clock Generation Circuit 500 to operate in an open-loop mode. As previously disclosed, open-loop mode operation may be enabled in different ways in various embodiments. As an example, in the embodiment of FIG. 9, the assertion of FM2 control signal 925 results in Phase Detect 901 and Frequency Divider 909 being disabled. Operation of Charge Pump 903 is determined based on the states of FM1 control signal 925 and FM2 control signal 926. In the current example, FM2 control signal 926 is asserted, causing Charge Pump 903 to sink current from LPF 905 through CP output signal 927. LPF 905 discharges, resulting in a reduced voltage level of LPF output signal 928. The reduced voltage level of LPF output signal 928 at the control input of VCO 907 causes VCO 907 to decrease the frequency of output clock 921.

For another example, in the embodiment of FIG. 11, the assertion of FM2 control signal 1125 results in Phase Detect 1101, Charge Pump 1103, and Frequency Divider 1109 being disabled. Operation of LPF 1105 is determined based on the states of FM1 control signal 1125 and FM2 control signal 1126. In this example, FM2 control signal 1126 is asserted, causing LPF 1105 to decrease the voltage level of its output, LPF output signal 1128. The decreased voltage level of LPF output signal 1128 is received as a control input to VCO 1107. A decreased voltage level at the control input of VCO 1107 causes VCO 1107 to decrease the frequency of output clock 1121. In either embodiment, the method may return to block 1404 to continue monitoring the clock signal.

If, in block 1410, it is determined that the frequency of the clock signal is less than the second threshold, then a phase of a divided clock signal is compared to a phase of the reference clock signal (block 1416). At this point in the illustrated embodiment, the frequency of output clock 521 has been determined to be between the first and second threshold values. It is noted that the values for the first and second thresholds may be selected based on various parameters of the design of Clock Generation Circuit 500 (or Clock Generation Circuit 900 or Clock Generation Circuit 1100 in various embodiments). For example, the values for the first and second thresholds may be selected to correspond to a target frequency −3% and the target frequency +3%, respectively. The thresholds, in other embodiments, may correspond to any suitable value and may not be symmetric around the target frequency. If necessary, Frequency Monitor 510 de-asserts FM1 control signal 525 or FM2 control signal 526 allowing Clock Generation Circuit 500 to operate in closed-loop mode, including enabling Phase Detect 501 to compare the phase of the divided clock signal (divider output signal 522) to the phase of ref clock 520.

The control signal is adjusted dependent upon the result of the phase comparison (block 1418). Clock Generation Circuit 500 operates in closed-loop mode while the frequency of output clock 521 is between the first and second threshold values. In closed loop-mode, Phase Detect 501 generates PD up signal 523 and PD down signal 524 dependent upon the relative phases of ref clock 520 and divider output 522. Charge Pump 503 sources or sinks current at its output dependent on the states of PD up signal 523 and PD down signal 524, respectively. LPF 505 receives CP output signal 527 and passes low frequency changes in the voltage level (i.e., slow voltage level changes) while filtering high frequency changes in the voltage level. LPF output signal 528 is received by VCO 507, which adjust the frequency of output clock 521 based on the received LPF output signal 528. Frequency Divider 509 receives output clock 521 and generates divider output 522 at a frequency that is divided down from the frequency of output clock 521.

It is noted that the method illustrated in FIG. 14 is merely an example. In other embodiments, variations of this method are contemplated. Some operations may be performed in a different sequence, and/or additional operations may be included. In some embodiments, some operations may occur in parallel.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
    an oscillator circuit configured to generate a clock signal dependent upon a control signal;
    a charge pump configured to use a current source to generate an output current; and
    circuitry configured to:
        perform a measurement of a frequency of the clock signal;
        perform a comparison of a phase of a divided clock signal to a phase of a reference clock signal in response to a determination that the frequency of the clock signal is greater than a first threshold frequency, wherein the phase of the divided clock signal is dependent upon a phase of the clock signal;
        in response to the determination that the frequency of the clock signal is greater than the first threshold frequency, adjust a value of the control signal such that the adjusted value depends upon a result of the comparison; and
        in response to a determination that the frequency of the clock signal is less than the first threshold frequency, adjust the value of the control signal by adjusting the current source based on a result of the measurement.

2. The apparatus of claim 1, wherein the circuitry includes a phase detection circuit configured to perform the comparison, and wherein the circuitry is further configured to decouple the divided clock signal from an input node of the phase detection circuit in response to the determination that the frequency of the clock signal is less than the first threshold frequency.

3. The apparatus of claim 2, wherein the circuitry is further configured to decouple an output of the phase detection circuit from an input node of the charge pump in response to the determination that the frequency of the clock signal is less than the first threshold frequency.

4. The apparatus of claim 1, wherein the circuitry includes a frequency divider circuit configured to generate the divided clock signal based on the clock signal, and wherein the circuitry is further configured to place the frequency divider circuit into a reduced power mode in response to the determination that the frequency of the clock signal is less than the first threshold frequency.

5. The apparatus of claim 1, wherein the circuitry includes a low pass filter circuit, and wherein the circuitry is further configured to adjust a frequency response of the low pass filter circuit in response to the determination that the frequency of the clock signal is less than the first threshold frequency.

6. The apparatus of claim 1, wherein the circuitry includes a phase detection circuit and wherein the circuitry is further configured to place the phase detection circuit into a reduced power mode in response to the determination that the frequency of the clock signal is less than the first threshold frequency.

7. The apparatus of claim 1, wherein the circuitry is further configured to:
    in response to a determination that the frequency of the clock signal is less than a second threshold frequency, adjust the value of the control signal such that the adjusted value depends upon the result of the comparison, wherein the second threshold frequency is greater than the first threshold frequency; and
    in response to a determination that the frequency of the clock signal is greater than the second threshold frequency, adjust the value of the control signal by adjusting the current source based on the result of the measurement.

8. A method for operating a clock generation circuit, comprising:
    generating a clock signal dependent upon a control signal;
    performing a measurement of a frequency of the clock signal;
    performing a comparison of a phase of a divided clock signal to a phase of a reference clock signal in response to determining that the frequency of the clock signal is greater than a first threshold frequency, wherein the phase of the divided clock signal is dependent upon a phase of the clock signal;
    charging, using at least one current source, a capacitor such that an amount of charge stored in the capacitor depends upon the result of the comparison;
    adjusting a value of the control signal such that the adjusted value depends upon a result of the comparison in response to determining that the frequency of the clock signal is greater than the first threshold frequency; and
    adjusting the value of the control signal by adjusting the at least one current source based on a result of the measurement in response to determining that the frequency of the clock signal is less than the first threshold frequency.

9. The method of claim 8, further comprising suspending performance of the comparison by decoupling the divided clock signal from a phase detection circuit in response to determining that the frequency of the clock signal is less than the first threshold frequency.

10. The method of claim 8, wherein adjusting the value of the control signal by adjusting the at least one current source includes enabling the at least one current source to increase the amount of charge stored in the capacitor.

11. The method of claim 8, further comprising:
    filtering the control signal using a low pass filter; and
    adjusting a frequency response of the low pass filter in response to determining that the frequency of the clock signal is less than the first threshold frequency.

12. The method of claim 8, further comprising disabling a portion of the clock generation circuit in response to determining that the frequency of the clock signal is less than the first threshold frequency.

13. The method of claim 8, further comprising:
in response to determining that the frequency of the clock signal is less than a second threshold frequency, adjusting the value of the control signal such that the adjusted value depends upon the result of the comparison, wherein the second threshold frequency is greater than the first threshold frequency; and
in response to determining that the frequency of the clock signal is greater than the second threshold frequency, adjusting the value of the control signal by adjusting the at least one current source based on the result of the measurement.

14. The method of claim 13, wherein adjusting the value of the control signal by adjusting the at least one current source includes disabling the at least one current source and enabling a current sink to decrease the amount of charge stored in the capacitor.

15. A system, comprising:
an oscillator circuit configured to generate a reference clock signal;
a processor configured to set a value in a register; and
a clock generation circuit configured to:
generate a clock signal dependent upon the reference clock signal and the value in the register;
perform a measurement of a frequency of the clock signal;
perform a comparison of a phase of a divided clock signal to a phase of the reference clock signal in response to a determination that the frequency of the clock signal is greater than a first threshold frequency, wherein the phase of the divided clock signal is dependent upon a phase of the clock signal;
in response to the determination that the frequency of the clock signal is greater than the first threshold frequency, adjust a value of a control signal such that the adjusted value depends upon a result of the comparison, wherein the frequency of the clock signal is dependent upon the value of the control signal; and
in response to a determination that the frequency of the clock signal is less than the first threshold frequency, adjust the value of the control signal such that the adjusted value depends upon a result of the measurement.

16. The system of claim 15, wherein the clock generation circuit includes a phase detection circuit configured to perform the comparison, and wherein the clock generation circuit is further configured to decouple the clock signal from an input node of the phase detection circuit in response to the determination that the frequency of the clock signal is less than the first threshold frequency.

17. The system of claim 16, wherein the clock generation circuit includes a charge pump configured to generate an output current dependent upon a signal at an input node of the charge pump, and wherein the clock generation circuit is further configured to decouple an output of the phase detection circuit from the input node of the charge pump in response to the determination that the frequency of the clock signal is less than the first threshold frequency.

18. The system of claim 15, wherein the clock generation circuit includes a charge pump configured to generate an output current dependent upon a current source, and wherein the clock generation circuit is further configured to enable the current source in response to the determination that the frequency of the clock signal is less than the first threshold frequency.

19. The system of claim 15, wherein the clock generation circuit includes a low pass filter circuit, and wherein the clock generation circuit is further configured to adjust a frequency response of the low pass filter circuit in response to the determination that the frequency of the clock signal is less than the first threshold frequency.

20. The system of claim 15, wherein the clock generation circuit is further configured to:
in response to a determination that the frequency of the clock signal is less than a second threshold frequency, adjust the value of the control signal such that the adjusted value depends upon the result of the comparison, wherein the second threshold frequency is greater than the first threshold frequency; and
in response to a determination that the frequency of the clock signal is greater than the second threshold frequency, adjust the value of the control signal such that the adjusted value depends upon the result of the measurement.

\* \* \* \* \*